United States Patent [19]

Watson et al.

[11] Patent Number: 4,797,179
[45] Date of Patent: Jan. 10, 1989

[54] FABRICATION OF INTEGRAL LENSES ON LED DEVICES

[75] Inventors: George P. Watson, Plainfield; Kathleen Meehan, Somerville, both of N.J.

[73] Assignee: Lytel Corporation, Somerville, N.J.

[21] Appl. No.: 60,772

[22] Filed: Jun. 9, 1987

[51] Int. Cl.$^4$ .................. H01L 21/306; B44C 1/22
[52] U.S. Cl. .................. 156/647; 156/649; 156/651; 156/661.1; 156/662; 252/79.4
[58] Field of Search ............ 156/647, 649, 651, 659.1, 156/661.1, 662; 252/79.2, 79.4; 357/30, 56; 372/43, 48; 437/3, 23, 127, 129, 228, 234; 430/312, 313, 316

[56] References Cited

U.S. PATENT DOCUMENTS

| | | | |
|---|---|---|---|
| 3,675,314 | 7/1972 | Levi | 156/649 X |
| 3,894,332 | 7/1975 | Nathanson et al. | 156/649 X |
| 4,172,005 | 10/1979 | Muraoka et al. | 156/647 |
| 4,279,690 | 7/1981 | Dierschke | 156/649 |
| 4,524,127 | 6/1985 | Kane | 156/647 |

OTHER PUBLICATIONS

S. Adachi, "Chemical Etching of InP and InGaAsP-/InP", pp. 609–613, *J. Electrochem Soc.*, vol. 129, No. 3, Mar. 1982.

S. Adachi and H. Kawaguchi, "Chemical Etching Characteristics of (001) InP," pp. 1342–1349, *J. Electrochem. Soc.*, vol. 128, No. 6, Jun. 1981.

J. Heinen and Lauterbach, "High-Radiance Surface-Emitting etc.," Siemens Forsch-8 Entwick-Lungsber, 1982, vol. 11.

J. Heinen, "Preparation and Properties etc.", *Electronic Lett.*, vol. 13, pp. 331–332, 1982.

O. Hasegawa and R. Namazu, "Coupling of Spherical--Surfaced Led etc.", *J. Appl. Phys.*, vol. 51 (1), pp. 30–36, Jan. 1980.

F. W. Ostermayer et al., "Photochemical Etching etc.", *App. Phys. Lett.*, vol. 43 (7), pp. 642–644, Oct., 1983.

*Primary Examiner*—William A. Powell
*Attorney, Agent, or Firm*—Marmorek, Guttman & Rubenstein

[57] ABSTRACT

Integrated lenses are fabricated on LED devices by chemical etching mesas through mask openings which are non-circular. The mask is removed and the mesas are then etched to form spherical lenses.

14 Claims, 3 Drawing Sheets

FABRICATION OF INTEGRAL LENSES ON LED DEVICES

FIELD OF THE INVENTION

The invention relates to the fabrication of integral lenses on LED devices, and particularly to the fabrication of spherical lenses having both good quality and high yields for the commercial fabrication of large quantities.

BACKGROUND OF THE INVENTION

Generally, a light-emitting diode (LED) is a pn junction semiconductor device designed to emit light when forward biased. The light can be one of several visible colors such as red, amber, yellow, or green, or it can be infrared and thus invisible. Electrically, an LED is similar to a conventional diode in that it has a relatively low forward voltage threshold. Once this threshold is exceeded, the junction has a low impedance and conducts current readily. This current is limited by an external circuit, usually a resistor. The amount of light emitted by an LED is typically proportional to the forward current over a broad range; thus, it is relatively easily controlled, either linearly or by pulsing.

LED devices are used in a wide variety of commercial systems and many of these systems have the LED devices coupling radiation into optical fibers. It is known in the prior art such as from the article entitled, "Coupling of Spherical-Surfaced LED and Spherical-Ended Fiber" by Osamu Hasegawa, Ryosuke Namazu, Masayuki Abe and Yoshikazu Toyama, J. Appl. Phys. Vol. 51 (1), January 1980, pp. 30-36 that the launching efficiency for radiation from an LED device having a spherical lens is generally superior to that using an LED device with no lens. This article does not disclose information relating to the fabrication of spherical lenses.

Integrated spherical lenses for LED devices have also been analyzed and studied experimentally. Reported data confirm that LED devices having spherical lenses are much better than flat LED devices for specific types of LED devices such as laser diodes and infrared light emitting diodes according to the article entitled "High-Radiance Surface-Emitting (In,Ga) (As,P)/InP IREDS" by J. Heinen and Ch. Lauterbach, Siemens Forsch.—8 Entwick-lungsber, 1982, Vol. 11. This article discloses general steps of fabricating a spherical lens on an LED device by first chemically etching a mesa extending above a wafer surface and thereafter, chemically etching the mesa to round out the edges and the top of the mesa to form a spherical lens. The article does not include any specific details for fabricating the lenses.

One of the authors, Heinen, subsequently published a letter entitled, "Preparation and Properties of Monolithically Integrated Lenses on InGaAs/InP Light-Emitting Diodes", Electronic Letters, Vol. 3, pp. 331-332, 1982. Heinen discloses fabricating a lens by first chemically etching a circular mesa in the substrate centered to the emitting area. A conventional masking of a circular masked area was used. Heinen used bromine:methanol (1:40) as the chemical etchant. The etch mask used to form the mesa was removed and the same etchant was used on the mesa to round it into a spherical lens. The spherical lens extended above the surface of the LED device.

It is known in the prior art that an integrated spherical lens is preferably well formed to focus radiation optimally. Deviations from a true spherical lens can produce losses in the transfer of radiation from an LED device to an optical fiber or other components in an optical system.

Generally, a well shaped spherical lens can be etched from a well shaped mesa using an isotropic chemical etchant. A well shaped mesa has circular cross sections which are concentric and also has a top generally parallel to the surface of the LED device. Generally, an "isotropic chemical etchant" as used herein etches a flat surface of a specific material equally in all directions.

It has been recognized in the prior art that the fabrication of mesas having circular cross sections can be achieved with an isotropic chemical etchant for the wafers used to fabricate the LED devices. Generally, the lenses are fabricated in the portion of the wafer composed of InP. The mesas extend above the surface of the wafer in each case.

Some chemical etchants suitable for etching InP are disclosed in the article entitled, "Chemical Etching Characteristics of (001) InP", by Sadao Adachi and Hitoshi Kawaguchi, J. Electrochem. Soc., June 1981, pp. 1342-1349. These chemical etchants include (1) HCl systems, (2) $HCl:HNO_3$ systems, (3) HBr systems, (4) $H_2SO_4:H_2O_2:H_2O$ systems, and $Br_2:CH_3OH$ system. The article discloses the capabilities of these etchants to etch isotropically for applications such as etching mesas extending above the surface of a wafer.

One of the authors, S. Adachi, subsequently published an article entitled "Chemical Etching of InP and InGaAsP/InP", J. Electrochem. Soc., March 1982, pp. 609-613. In this article, an etchant composition of aqueous HBr, $CH_3COOH(H_3PO_4)$ and $K_2Cr_2O_7$ is disclosed as being an improved chemical etchant for isotropically etching InGaAsP/InP wafers and having the additional advantage of not eroding photoresists such as commercially available AZ-1350. The article discloses that the ratio of the components can vary. The chemical etchant of the article is referred to in the article and herein as "BPK".

Adachi discloses that the etching rate of BPK is greater for a stirred solution than a non-stirred solution. Stirring does not produce a sufficiently random movement of the BPK to avoid non-uniform etching. Non-stirred solutions are preferable for etching. Adachi shows that a non-stirred BPK solution can etch a relatively pit free surface for concentrations greater than a certain level. Furthermore, for relatively low concentrations, the BPK solution tends to produce pits. Adachi concludes that the BPK is a good isotropic chemical etchant for both InP and InGaAsP/InP double heterostructure wafers and can be used to produce mesa-shaped structures with good resist pattern definition. Adachi does not, however, consider the suitability of the BPK for fabricating an integrated lens on an LED device.

An integral lens on an LED device can also be fabricated using photoelectrochemical etching as disclosed in the article entitled, "Photoelectrochemical Etching of Integral Lenses on InGaAsP/InP Light-Emitting Diodes", by F. W. Ostermayer, Jr., P. A. Kohl and R. H. Burton, Appl. Phys. Lett., Vol. 43, No. 7, October 1983, pp. 642-644. The invention disclosed herein relates to the use of a chemical etchant. The article is of interest because it discloses etched lenses which are below the surface of the LED device. There is no disclosure in the article relative to the advantages of such a configuration.

The following is a discussion of prior art commercial practices for fabricating integral spherical lenses on LED devices and the results of a study of these processes by the applicant.

The commercial fabrication of LED devices is typically carried out using a wafer as large as about 2 cm. by 2 cm. with a plurality of LED devices being formed in the wafer. Some of the difficulties in fabricating integrated lenses include chemically etching uniform mesas heights across the wafer and thereafter, etching smooth, well-defined spherical lenses from the mesas.

Tests have been carried out by the applicant using BPK and it has been found that good integrated spherical lenses can be fabricated when the lenses extend above the surface of the wafer. For such lenses, the mesas are produced by chemically etching the wafer surface around etch masks defining the top surfaces of the mesas. The etch masks are removed, and thereafter, the mesas are etched into spherical lenses.

A study by the applicant of the commercial process for fabricating raised spherical lenses on LED devices shows that the yields are not high due to many problems. One of the problems in the prior art is that the large surface area of the wafer being etched results in the chemical etchant near the edges of the wafer having a greater concentration than the chemical etchant near the center of the wafer. This is due to the chemical etchant near the edges being replenished more readily than the portion near the center of the wafer. As a result, the mesas near the edges of the wafer tend to be thinner than the centrally located mesas and the spherical lenses etched near the edges of the wafer are relatively small and undesirable.

Another problem in the prior art is that spherical lenses extend above the surface of a wafer and can be damaged relatively easily during subsequent processing steps. It has now been concluded that damages to lenses can be minimized by fabricating integrated spherical lenses below the surface of the wafer. Furthermore, the spherical lenses can be fabricated so that much less of the surface of the wafer is etched as compared to the prior art process.

An attempt was carried out by the applicant to fabricate integrated recessed spherical lenses on a wafer including LED devices using prior methods. Such recessed lenses were fabricated by initially chemically etching mesas defined by annular mask openings centered at the emitting areas of each LED device. The annular mask openings were defined by two concentric circles. It was planned that subsequently the masking would be removed and the mesas would be etched into the spherical lenses.

Surprisingly, it was found that mesas etched through the annular masks did not exhibit circular cross sections even though BPK was used. The BPK etched anisotropically when used on the annular mask openings. An analyst suggested that for this chemical etching, the mesas generally had slanted walls along the (111A) planes. This problem did not occur for mesas chemically etched to be above the surface of the LED device.

The chemical etching of mesas through annular openings was repeated with the change of making the annular openings much larger. Again, BPK was used. It was found that enlarging the annular openings can reduce or avoid the anisotropic etching because the chemical etching is closer to the conditions for which the mesas are formed above the surface of the wafer. This solution to the problem of anisotropic etching has serious drawbacks including leaving little space on each LED device for attaching a ball bond. Enlarging the area for each LED device reduces the number of devices which can be fabricated on a wafer.

It would be a commercial advantage to have a method of fabricating recessed spherical lenses on LED devices in which the lenses were well formed to provide good coupling of radiation, and in which the production yields of the LED devices were high.

SUMMARY OF THE INVENTION

The invention relates to fabricating integrated spherical lenses on LED devices. An isotropic chemical etchant such as BPK is used on a wafer having a plurality of InGaAsP/InP light emitting diodes (LED). A conventional etchant mask is used to etch mesas. The etchant mask defines solid circular first portions over the regions of the LED's on the wafer from which radiations are to be emitted and a solid second portion spaced away from the first portions to define unmasked areas of the wafer around each first portion.

The unmasked areas between the first and second portions are not annular openings. These unmasked areas are selected so that chemical etching produces mesas having substantially circular cross sections.

In an illustrative embodiment the second portion defines square openings oriented so that the diagonals substantially start at the (111A) planes and each square opening has its center substantially at the center of the associated first portion. The BPK is suitable for the chemical etchant.

After the mesas are etched, the etchant mask is removed using commercial methods and the mesas are chemically etched to produce spherical lenses. The BPK is also suitable for this etching. This etching can be carried out using conventional techniques.

The spherical lenses fabricated according to the invention are recessed below the surface of the wafer and are well shaped over most of the wafer.

For purposes of clarity, the drawings have not been drawn to scale.

DETAILED DESCRIPTION OF THE INVENTION

Figure 1:
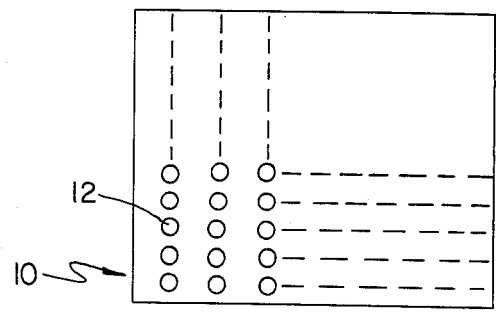
FIG. 1 is a plan view of a wafer masked for chemically etching mesas according to the prior art.

FIG. 1 shows a typical prior art masking arrangement for chemically etching mesas for fabricating integral spherical lenses on LED devices. A wafer 10 has circular masks 12 positioned above the areas from which radiation is emitted by each of the LED devices defined in the wafer 10. The masks are fabricated using conventional techniques and can be made of SiO₂ or a photoresist if a compatible chemical etchant is used. Thereafter, the wafer is isotropically chemically etched in a conventional method to produce a plurality of mesas corresponding to each of the masks 12.

Figure 2:
FIG. 2 is a typical cross sectional view of some mesas produced by chemically etching the masked wafer shown in FIG. 1.

FIG. 2 shows a typical cross sectional view for some mesas 14 produced from etching the wafer 10. Although not shown in FIG. 2, it is well known in the prior art that the mesas 14 produced near the edges of the wafer 10 are not as well defined as the mesas 14 produced in the central area of the wafer 10. The mesas 14 near the edges have deeper undercuts than the centrally located mesas 14 and the deeper undercut mesas 14 produce spherical lenses with small radii. Lenses with large radii are generally more desirable for many applications. Thus, the mesas 14 near the edges result in unusable LED devices, thereby reducing the yield for the fabrication process.

Another problem in etching the mesas 14 is that the heights of the mesas 14 above the surface of the wafer can vary from the mesas 14 at the edges of the wafer 10 to the mesas 14 at the central portion of the wafer 10. This is particularly evident for relatively large wafers. Ordinarily, the etchant is maintained stagnant during the etching because stirring usually produces non-uniform etching patterns. The stagnant etching is a diffusion-controlled process. As a result, the edges of the wafer 10 have a greater opportunity for etchant replenishment than the central portion of the wafer 10 so that the edges can be etched faster. Maintaining the wafer level in the chemical etchant tends to reduce this problem by minimizing an apparent flow of the etchant over the surface of the wafer.

The next conventional processing step for the wafer 10 is the removal of the masks 12 from the mesas 14. Subsequently, the mesas 14 are chemically etched to transform the upper portions of the mesas 14 from being flat to being spherical. Accordingly, integral lenses on the LED devices are produced and these spherical lenses are raised above the surface 16 of the wafer 10. It has been found that during additional production operations, the raised spherical lenses can be damaged. Such damage includes lenses being broken off, or being scratched, or being otherwise deformed.

Figure 3:
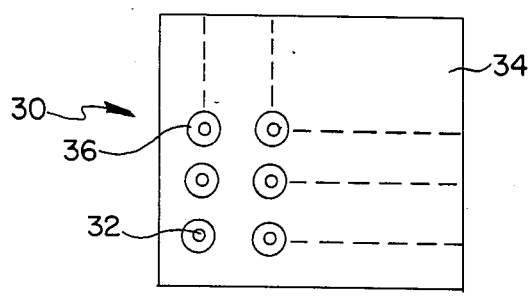
FIG. 3 is a plan view of a wafer masked for chemically etching mesas for fabricating recessed spherical lenses according to the prior art.

To avoid the vulnerabilities of raised spherical lenses to damage during manufacturing, fabrication of recessed lenses was undertaken. Recessed spherical lenses were produced by the use of a masked arrangement as shown in FIG. 3. A wafer 30 having a plurality of LED devices defined therein has circular masking portions 32 positioned over the areas from which radiation will be emitted from each LED device. In addition, circular masking portion 34 defining annular openings 36 around the masking portions 32 is on the wafer 30. The wafer 30 corresponds to the wafer 10 so that the spacing between emitting areas of the respective LED devices are the same. Thus, the spacing between circular masking portions 32 is substantially the same as the spacing between the circular masking portions 12. This implies a limitation on the maximum radius of the annular openings 36 in order to provide space on each LED device for ball bonding.

Figure 4:
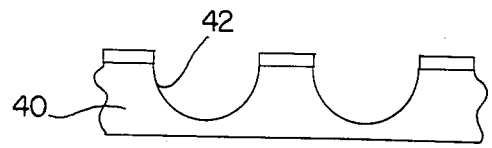
FIG. 4 is a cross sectional view on an enlarged scale of some mesas obtained by chemically etching the masked wafer shown in FIG. 3.

The mesas resulting from using BPK were non-circular. That is, the chemical etchant etches anisotropically despite its description in the prior art of being an excellent isotropic chemical etchant for the instant wafer. FIG. 4 shows a portion of a cross sectional view of a wafer 40, having some mesas having sides 42 which are relatively flat rather than curved. The flat sides 42 are believed to be due to the (111) plane.

Ordinarily, an isotropic chemical etchant such as BPK etches substantially isotropically but in this situation it etches anisotropically. It is believed that a relatively small annular opening for the chemical etching does not provide a good opportunity for the etchant to etch other planes around the (111A) planes. A test was conducted, using relatively large annular openings and it was found that mesas having relatively good circular cross sections were obtained. This method requires a larger area for each LED device relative to the area used in FIG. 1 because of the space needed on each device for ball bonding. This method of overcoming the problem is economically unattractive because it reduces the number of LED devices which can be produced for each wafer.

Figure 5:
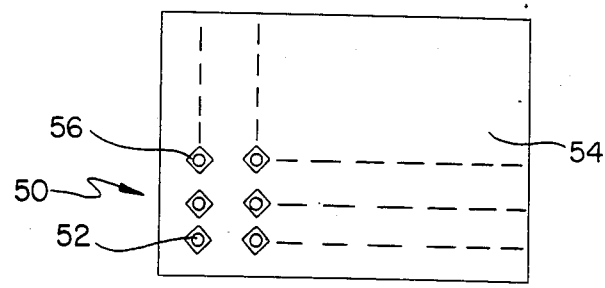
FIG. 5 shows a plan view of a wafer masked for etching mesas in accordance with the invention.

Turning now to the invention, a mask arrangement as shown in FIG. 5 was used on a wafer 50. The wafer 50 has a plurality of LED devices defined in it. The mask can be Si:O₂ or a photoresist, or the like. The mask is selected to be resistive to attack or deterioration due to the chemical etchant. The mask is applied and formed into the masking arrangement using conventional techniques. Each circular masking portion 52 covers the area from which radiation will be emitted from an LED device and a second masking portion 54 defines square openings 56. The spacing between the circular masking portion 52 can correspond to the spacing between the circular masking portion 12 in FIG. 1.

For the embodiment shown in FIG. 5, each square opening 56 is oriented 45 degrees relative to the cleaved wafer edges that surround the respective mesa to be etched. The square openings 56 in FIG. 5 have the (111A) planes at the diagonals while the edges of the square openings 56 provide sufficient room for each LED device for ball bonding. The masking arrangement shown in FIG. 5 compensates for the different etching rates in different directions of an isotropic chemical etchant which etches anisotropically for a relatively small mask opening.

An additional benefit from the use of the embodiment shown in FIG. 5 is that uniformity in the mesa height across the wafer 54 is obtained because only a relatively small portion of the wafer 50 is etched. It is believed that this is due to the etchant not being readily depleted in the central portion of the wafer 50 as compared to the edges of the wafer 50 as in the case of the prior art masking arrangement shown in FIG. 1.

The chemical etching of the mesa using the configuration shown FIG. 5 can be carried out using a conventional isotropic chemical etchant and conventional techniques. For example, the chemical etchant can be BPK with a concentration of about 2:2:3 by volume ratio using 1N K₂Cr₂O₇. The etching is preferably carried out at 25° C.±0.5° C. with no agitation.

Figure 6:
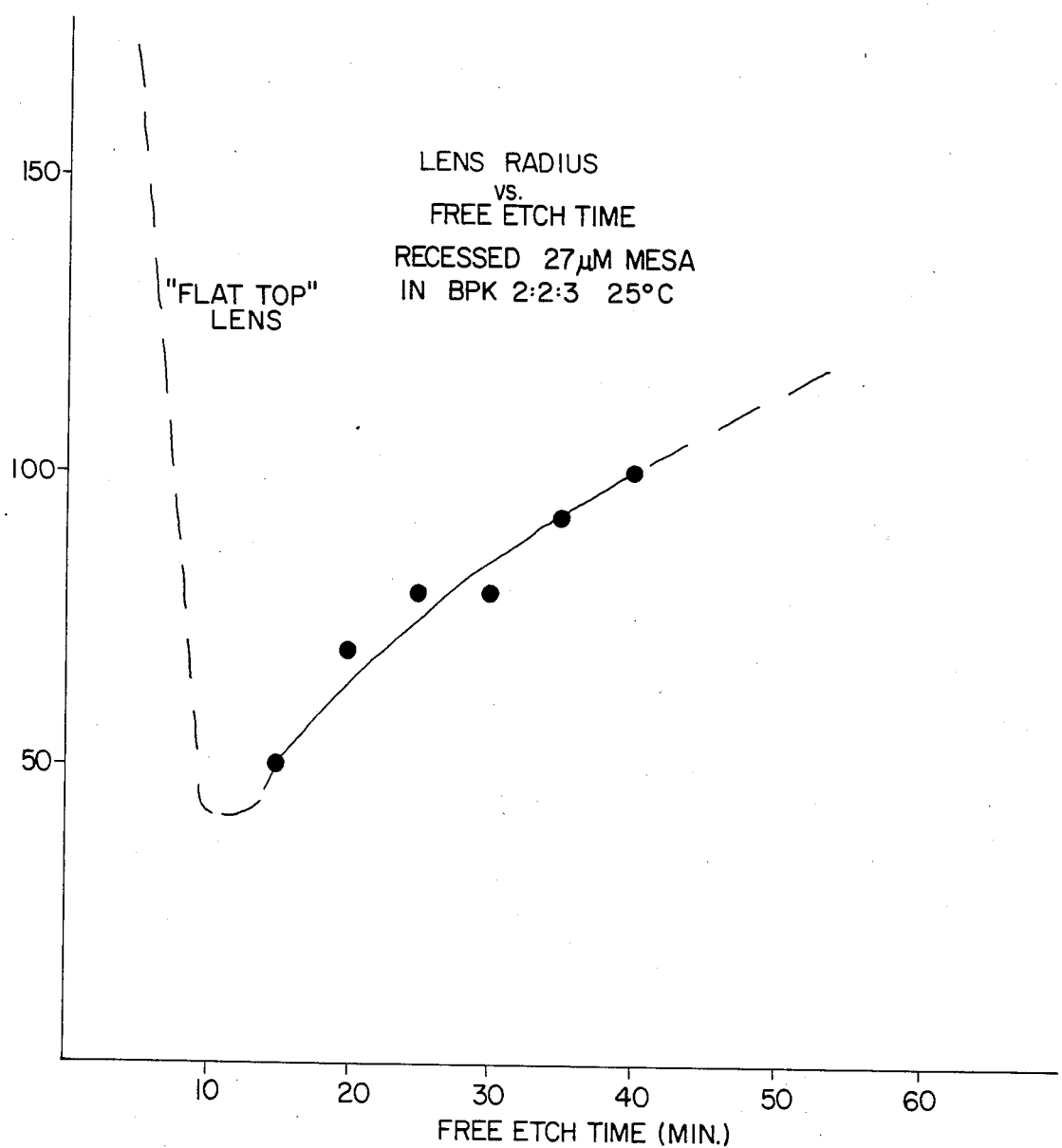
FIG. 6 is a graph relating spherical lens radius to chemical etch time for a mesa using BPK.

After the mesas are etched, the conventional techniques of removing the masking and etching the mesas are carried out to produce spherical lenses. The same BPK and temperature can be used. FIG. 6 shows a graph relating lens radius versus etching time for a recessed 27 micron mesa using the same BPK and the same temperature given above. An etching time of about 35 minutes will produce a spherical lens having a radius of about 90 microns.

Variations of the masking arrangement as shown in FIG. 5 can be used according to the principles disclosed herein. For example, opposite vertices of the square can be rounded. That is, the shape of the opening around each mesa to be etched compensates for the anisotropic etching of an isotropic chemical etchant which is adversely influenced by a relatively small opening.

It has been reported in the prior art that BPK does not attack photoresist. This, according to the prior art, enables a photoresist mask to be used for chemical etching rather than an $SiO_2$ mask and thereby reduces the number of process steps needed to fabricate the spherical lenses.

It has now been discovered that the bromine fumes above the BPK composition can severely deteriorate a photoresist mask while a wafer is being immersed into the BPK composition. In addition, the wafer itself can be attacked by the bromine fumes to produce a rough mottled surface.

It has been found that damage due to bromine fumes can be avoided by coating the wafer surface with a small quantity of dilute $H_3PO_4$. This acid does not attack either the photoresist or the wafer and readily mixes with the BPK. This wafer coating step has been used satisfactorily with the fabrication of raised lenses.

When the wafer coating step was used in the fabricating of integrated spherical lenses according to the invention, deeply etched pits were observed in the corners of the mask openings 56 shown in FIG. 5 after the mesas were etched. It is believed that the $H_3PO_4$ combined with the BPK to produce a relatively dilute composition of BPK at the surface of the wafer. The diluted BPK produces pits as disclosed in the aforementioned article by Adachi.

The use of $SiO_2$ masks appears to minimize these problems and may be economically attractive for the invention due to good quality integrated spherical lenses on LED devices obtained along with high yields.

The embodiments of the invention disclosed herein are intended to be illustrative only. Numerous alternative embodiments may be devised by those skilled in the art without departing from the spirit and scope of the following claims.

We claim:

1. A method of fabricating LED devices from a wafer having LED's defined therein, comprising
   forming a substantially circular first masking portion over each area of said wafer from which radiation would be emitted; and
   forming a second masking portion on said wafer to define unmasked portions associated with said first masking portions; said unmasked portions being non-circular and shaped relative to a chemical etchant so that said chemical etchant can etch said wafer to produce mesas having substantially circular cross sections.

2. The method of claim 1, further comprising thereafter, etching said masked wafer to produce said mesas.

3. The method of claim 2, wherein said etching is carried out using an isotropic chemical etchant.

4. The method of claim 3, wherein said chemical etchant is BPK.

5. The method of claim 2, further comprising the steps of removing the masking portions and etching said mesas to form spherical lenses.

6. The method of claim 5, wherein said mesas are etched using BPK.

7. The method of claim 1, wherein said unmasked portions define substantially rectangular shapes in which (111A) planes of said wafer substantially align with diagonals of said rectangular shapes.

8. The method of claim 7, wherein said rectangular shapes are substantially squares.

9. A method of fabricating closely spaced recessed mesas on a wafer, comprising
   forming a substantially circular first masking portion over each area of said wafer at which a mesa is to be produced; and
   forming a second masking portion on said wafer to define unmasked portions associated with said first masking portions; said unmasked portions being non-circular and shaped relative to a chemical etchant so that said chemical etchant can etch said wafer to produce said mesas whereby said mesas have substantially circular cross sections.

10. The method of claim 9, further comprising thereafter, etching said masked wafer to produce said mesas.

11. The method of claim 10, wherein said etching is carried out using an isotropic chemical etchant.

12. The method of claim 11, wherein said chemical etchant is BPK.

13. The method of claim 9, wherein said unmasked portions define substantially rectangular shapes in which (111A) planes of said wafer substantially align with diagonals of said rectangular shapes.

14. The method of claim 13, wherein said rectangular shapes are substantially squares.

* * * * *